(12) United States Patent
Ishihara

(10) Patent No.: US 7,019,263 B2
(45) Date of Patent: Mar. 28, 2006

(54) SUBSTRATE HEATING APPARATUS AND MULTI-CHAMBER SUBSTRATE PROCESSING SYSTEM

(75) Inventor: Masahito Ishihara, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/925,909

(22) Filed: Aug. 26, 2004

(65) Prior Publication Data

US 2005/0045616 A1   Mar. 3, 2005

(30) Foreign Application Priority Data

Aug. 28, 2003  (JP) ............................. 2003-303992

(51) Int. Cl.
  *F27B 5/14*  (2006.01)

(52) U.S. Cl. ..................... 219/390; 219/405; 219/411; 392/416; 392/418; 118/724; 118/725; 118/50.1

(58) Field of Classification Search ................ 219/390, 219/405, 411; 392/416, 418; 118/724, 725, 118/50.1

See application file for complete search history.

(56) References Cited

U.S. PATENT DOCUMENTS

| 6,843,202 B1 * | 1/2005 | Kusuda ...................... 118/733 |
| 6,896,513 B1 * | 5/2005 | Bachrach et al. ........... 432/121 |
| 6,900,413 B1 * | 5/2005 | Ratliff et al. ............... 219/390 |

FOREIGN PATENT DOCUMENTS

| JP | 11-506821 | 6/1999 |
| JP | 2003-13215 | 1/2003 |

* cited by examiner

*Primary Examiner*—Shawntina Fuqua
(74) *Attorney, Agent, or Firm*—Manabu Kanesaka

(57) ABSTRACT

This application discloses a substrate heating apparatus comprising a partition separating the inside of a load-lock chamber into two areas. An inside opening provided in the partition is closed by a partition valve, while the second area in which a substrate is transferred is evacuated at a vacuum pressure by a pumping line. After the partition valve is opened, a carrier carries the substrate through the inside opening, thereby contacting the substrate onto a heat body disposed in the first area. Otherwise, after the partition valve is opened, a carrier carries a heat body through the inside opening, thereby contacting the substrate onto the heat body in the second area. This application also discloses a substrate processing system comprising a transfer chamber, and a load-lock chamber and a process chamber both provided on the periphery of the transfer chamber.

32 Claims, 7 Drawing Sheets

SUBSTRATE HEATING APPARATUS AND MULTI-CHAMBER SUBSTRATE PROCESSING SYSTEM

BACKGROUND OF THE INVENTION

1. Field of the Invention

This invention relates to a substrate heating apparatus for heating a substrate under a vacuum pressure, and to a multi-chamber substrate processing system for processing a substrate under a vacuum pressure.

2. Description of the Related Art

Electronic parts such as semiconductor devices, e.g., memories and processors, all kinds of circuit elements, and sensing element are often manufactured via lots of surface processes onto board-shaped objects as bases of products, which are hereinafter called "substrates". Such a surface processes has been well known as surface denaturalizing, e.g., surface oxidation, thin-film deposition, or circuit formation process, e.g., etching. In addition, substrate heating process has been often carried out on various purposes. For example, pre-heating of a substrate has been carried out for degassing prior to thin-film deposition. Annealing of a substrate has been carried out after thin-film deposition or ion implantation. Baking of a substrate has been carried out before or after light exposure of photoresist.

A substrate heating apparatus used for such a heating process often has a structure where a substrate is heated under a vacuum pressure. This is because heating under atmospheric pressure highly probably brings the problem that moisture, oxygen or other contaminant is incorporated into the substrate. Heating under a vacuum pressure is carried out in an air-tight vessel, i.e., vacuum chamber, placing a substrate therein.

Prior-art substrate heating apparatuses will be described, referring to FIGS. 6 and 7. FIG. 6 is the schematic front cross-sectional view of a prior-art heating apparatus. FIG. 7 is the schematic front cross-sectional view of another prior-art heating apparatus. The apparatus shown in FIG. 6 is built in a so called cluster-tool-type system. "Cluster tool" is the general term for a vacuum processing system where a transfer chamber comprising a transfer robot therein is provided centrally, and a load-lock chamber and process chambers are connected with the transfer chamber at the periphery. In FIG. 6, the load-lock chamber 83 is the vacuum chamber where the substrate 9 is temporarily stored while it is transferred from the atmospheric outside to one of the process chambers 82. The system comprises a vacuum chamber called "unload-lock chamber" (not shown), in which the substrate 9 is stored while it is transferred out from one of the process chambers 82 to the atmospheric outside. The load-lock chamber 83 is occasionally used commonly for the unload-lock chamber.

The heating apparatus shown in FIG. 6 comprises a heat chamber, which is one of the process chambers 82. A heat stage 821 is provided in the heat chamber 82. An elevation mechanism 822 is provided outside the heat chamber 82 so that the heat chamber 82 can be elevated up and down. Through holes are provided vertically penetrating the heat stage 821. Transfer pins 823 are inserted into the through holes respectively. For example, three through holes are provided, and three transfer pins 823 are inserted respectively.

A heater 824 is provided in the heat stage 821. The substrate 9 stored in the load-lock chamber 83 by an auto loader (not shown) is then transferred to the heat chamber 82 by the transfer robot 811. The heat stage 821 is located at a lower position on standby. In this state, the upper ends of the transfer pins 823 project over the heat stage 821.

The substrate 9 is passed from the transfer robot 811 onto the transfer pins 823. Afterward, the heat stage 821 is elevated up by the elevation mechanism 822. As a result, the substrate 9 is placed on the heat stage 821, being heated thereby. After heating the substrate 9 for a required period, the heat stage 821 is elevated down, placing the substrate 9 on the transfer pins 823 again. Afterward, the transfer robot 81 transfers the heated substrate 9 out of the heat chamber 82 to the load-lock chamber 83. Then, the substrate 9 is transferred out to the atmospheric outside by the auto loader.

The system shown in FIG. 7 comprises a means for heating a substrate 9 in a load-lock chamber 83. An opening is provided in the upper wall of the load-lock chamber 83. A transparent window 831 is air-tightly fitted in the opening. A lamp heater 833 is provided outside the transparent window 831. Radiant rays from the lamp heater 833 illuminate the substrate through the transparent window 831, heating the substrate 9 thereby. After heating, the substrate 9 is processed in a process chamber 84.

In heating a substrate generally, it is effective to make the substrate contact onto a hot body, i.e., to utilize heat transfer by conduct. The heating apparatus shown in the FIG. 6 belongs to this type. In this type, however, when the hot body is exposed to the atmosphere, the surface of the body would be oxidized; otherwise dusts or other contaminants thermally adhere to the body. As a result, particles contaminating the substrate would be produced from the body.

Therefore, it is preferable to dispose such a hot body for heating in an atmosphere of a vacuum pressure normally. The apparatus shown in FIG. 6 comprises the chamber 82 solely used for the heating, to which the load-lock chamber 83 is connected via the transfer chamber 81 with the continuous vacuum environment. The environment in the load-lock chamber 83 is alternately converted to the atmosphere and vacuum, which is accompanied by the transfer-in-and-out of the substrate 9. On the other hand, the heat chamber 82 is kept at a vacuum pressure normally, because the transfer valve 825 is closed for isolation while the load-lock chamber 83 is opened to the atmosphere.

The above-described structure of the apparatus shown in FIG. 6 enables disposition of the hot heat stage 821 in the vacuum environment normally. However, the apparatus shown in FIG. 6 has the demerit that the number of the chambers increases, that is, the apparatus is larger-scaled. This brings the problem of increasing the cost and the occupation space of the apparatus. In addition, respecting to productivity it brings the problem of decreasing the total process efficiency because more time is needed for transferring the substrate.

On the other hand, the apparatus shown in FIG. 7 does not bring the above-described problem of the contamination, because the radiation heating is employed, disposing the lamp heater 832 outside the load-lock chamber 83. However, the radiation heating has the difficulty in making radiating ray density distribution, i.e., illumination distribution, sufficiently uniform on the surface of the substrate. It means in-plane uniformity of the heating is not sufficient. In addition, in the case it is required to heat a glass substrate, which typically happens in manufacturing a display device such as liquid crystal display and plasma display, efficiency can not be expected for the heating because radiating rays are not absorbed in the substrate but pass through it.

Moreover, the radiation heating has the problem of dependency on the surface state of a substrate. In the case a film of high reflectivity is coated on the right surface of a substrate, for example, heat efficiency would decrease much. As well, radiation absorption rate depends on the surface state of a substrate. For example, it changes depending on a rugged surface by etching or a mirror-polished surface. Because the radiation heating depends on such factors as material of the substrate and surface state of the substrate, it has the difficulty in heating a substrate with high stability and reproducibility.

SUMMARY OF THE INVENTION

This invention is to solve the above-described problems, and presents a practical technique to heat a substrate, neither accompanying the substrate contamination, nor bringing necessity of more number of chambers, nor depending on material and surface state of a substrate. Specifically, the substrate heating apparatus of the invention comprises a partition separating the inside of a load-lock chamber into two areas of the first and the second. An inside opening provided in the partition is closed by a partition valve, while the second area in which a substrate is transferred is evacuated at a vacuum pressure by a pumping line. After the partition valve is opened, a carrier carries the substrate through the inside opening, thereby contacting the substrate onto a heat body disposed in the first area. In another substrate heating apparatus of the invention, after the partition valve is opened, a carrier carries a heat body through the inside opening, thereby contacting the substrate on the heat body in the second area. This invention also presents a substrate processing system comprising a transfer chamber, and a load-lock chamber and a process chamber both provided on the periphery of the transfer chamber. Structure in the load-lock chamber is the same as in any one of the substrate heating apparatuses.

DETAILED DESCRIPTION OF THE PREFERRED EMBODIMENTS

Figure 1:
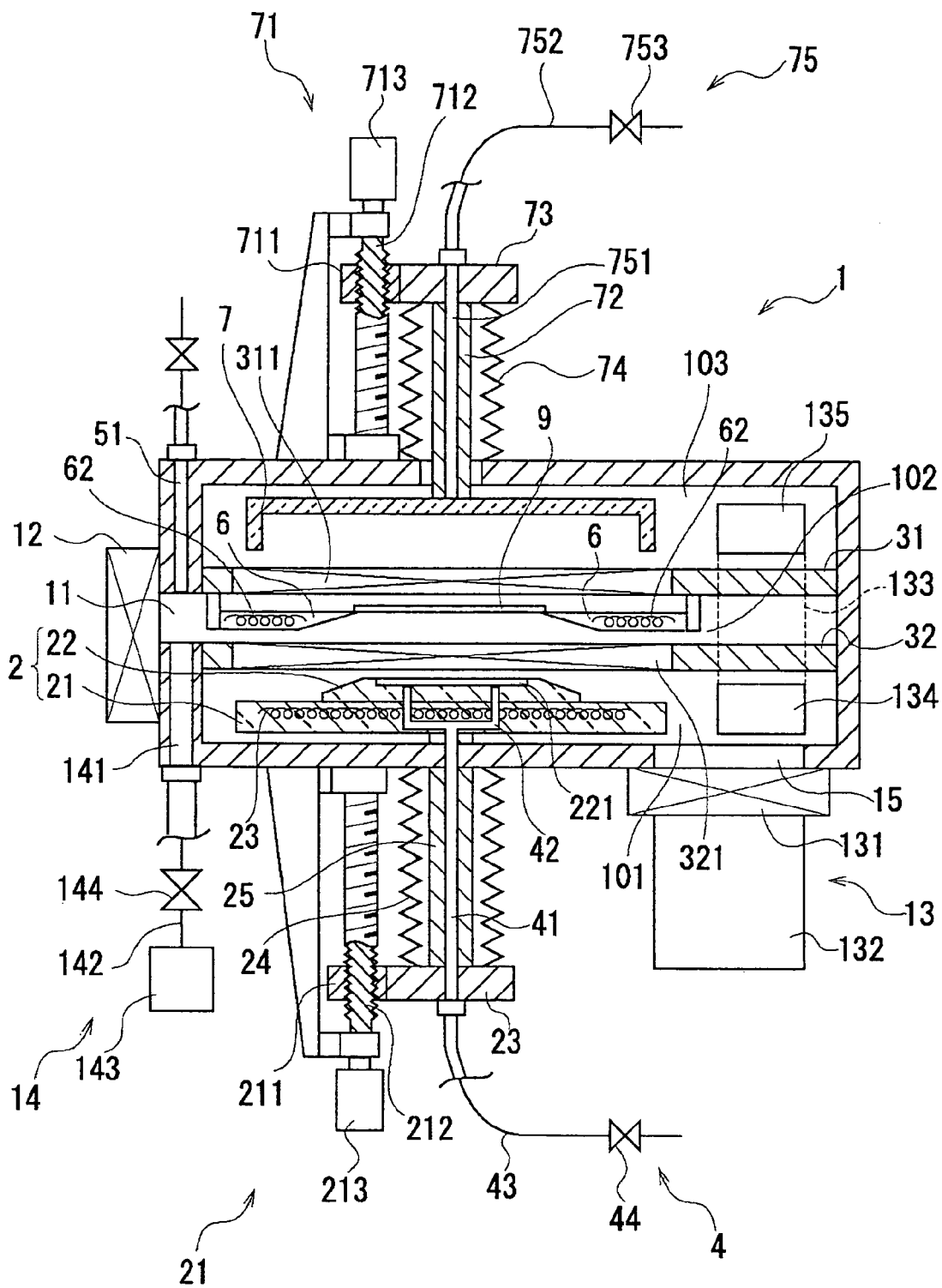
FIG. 1 is a schematic front cross-sectional view of a substrate heating apparatus as a preferred embodiment of the invention.

The preferred embodiments of this invention will be described as follows. The apparatus of the embodiment shown in FIG. 1 comprises a vacuum chamber 1 comprising a pumping line, and a heat body 2 for heating a substrate contacted thereon in the vacuum chamber 1.

A couple of partitions 31,32 are provided in the vacuum chamber 1, separating the inside of the vacuum chamber 1 into three areas 101,102,103. The partitions 31,32 are horizontal and disposed upper and lower. Hereinafter, the area 102 between the upper partition 31 and the lower partition 32 is called "center area". The area 103 over the upper partition 31 is called "upper area". The area 101 under the lower partition 32 is called "lower area".

The heat body 2 is disposed in the lower area 101 on standby. The heat body 2 is a stage-like member, on which a substrate 9 is placed to be heated. The heat body 2 comprises a plank-shaped body base 21 and an acceptor 22 fixed on the body base 21. The substrate 9 is placed on the acceptor 22. The acceptor 22 is smaller than the body base 21. A heater 23 of the resistance heating type is provided in the body base 21.

The heat body 2 is capable of being carried by a body carrier 21 provided outside the vacuum chamber 1. The heat body 2 is supported by a column 25. A hole through which the column 25 is inserted is formed in the bottom wall of the vacuum chamber 1. A bracket 23 is provided at the bottom end of the column located beneath the vacuum chamber 1.

The body carrier 21 comprises a driven screw 211 fixed to the bracket 23, a driving screw 212 engaging the driven screw 211, and a motor 213 to rotate the driving screw 212. The driven screw 211 and the driving screw 212 compose a so called "precision gear mechanism". The driving screw 212 is vertically lengthened and fixed to the bottom wall of the vacuum chamber 1 by a fixation member 214. The driving screw 212 is capable of rotation around a vertical axis and not capable of elevation. The motor 213 is a kind of servo motor, which rotates the driving screw 212 to elevate up and down the driven screw 211, thereby elevating up and down the bracket 23, the column 25 and the heat body 2 together. A bellows 24 is provided downward on the bottom wall of the vacuum chamber 1. The upper end of the bellows 24 surrounds the rim of the hole through which the column 25 is inserted. The bellows 24 prevents leakage of vacuum through the hole.

The apparatus comprises a heat-exchange gas introduction line 4. The heat-exchange gas introduction line 4 introduces a gas into the interface between the placed substrate 9 and the heat body 2, thereby enhancing heat exchange between them. The back surface of the substrate 9 and the top surface of the acceptor 22, which contact to each other, are not completely flat, but minutely rugged. Accordingly, minute spaces are formed at the interface between them. Those spaces would have poor thermal conductivity when those are at a low pressure of vacuum. Therefore, the gas for heat exchange is introduced to increase pressure in those spaces, thereby increasing the heat exchange efficiency. As the heat-exchange gas, a gas with high coefficient of thermal conductivity such as helium is used.

At the upper surface of the acceptor 22 is provided a concavity 221. The concavity 221 is a little smaller than the substrate 9 in the plan view. The concavity 221 is shut by the placed substrate 9. The heat exchange gas is introduced into the shut concavity 221. A heat-exchange gas introduction channel 41 is provided at the column 25 and the bracket 23. The heat-exchange gas introduction channel 41 communicates with the concavity 221 at the heat body 2, penetrating the column 25 and the bracket 23. The heat-exchange gas introduction channel 41 in the heat body 2 branches in multiple radial horizontal directions. Each radial channel 41 is curved upward, reaching to the concavity 221.

A pipe 42 communicating with a bomb (not shown) is connected to the heat-exchange gas introduction channel 41. A valve 44 and a gas flow controller (not shown) are provided on the pipe 43. A filter (not shown) is provided on the pipe 43 to eliminate foreign matters and contaminants.

An opening 11 is provided in the wall of the vacuum chamber 1 at a position as high as the center area 102. The opening 11 is for transferring the substrate 9 in and out, hereinafter called "transfer opening". A valve 12, hereinafter "transfer valve", is provided to close the transfer opening 11. A gas-flow screening mechanism is provided for the transfer opening 11. The gas-flow screening mechanism makes a flow of a gas for screening along a plane a little inside to the transfer opening 11. The side wall of the chamber 1 has a screening-gas supply channel 51 at the part located higher than the transfer opening 11. The outlet of the channel 51, hereinafter "gas outlet", is located near the upper edge of the transfer opening 11. The gas outlet is slot-shaped and lengthened to the width direction of the transfer opening 11. The gas-flow screening mechanism supplies the screening gas via the gas outlet, making the screen-like flow of the gas from the gas outlet. This screen-like flow blocks intrusion of undesired matters, e.g., moisture, oxygen and dusts. Inert gas such nitrogen or argon, or dried air is used as the screening gas.

A retainer 6 is provided in the center area 102. The retainer 6 temporarily retains the substrate 9 when it is transferred to and from the heat body 2. While the retainer 6 retains the substrate 9, the center area 102 is evacuated to be at a vacuum pressure, as described later.

Figure 2:
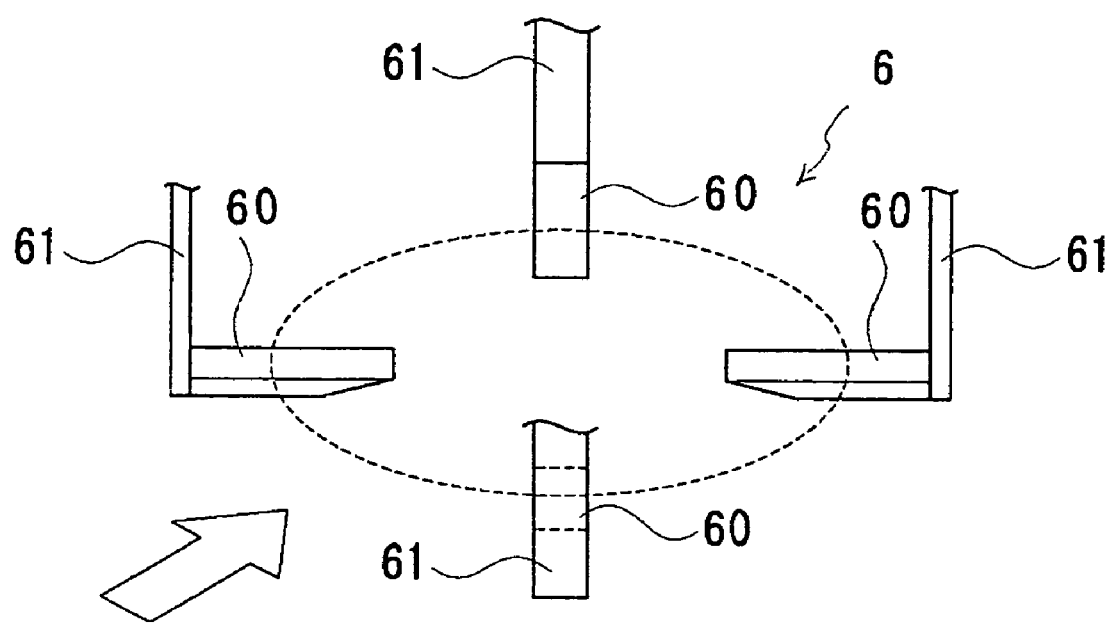
FIG. 2 is a schematic solid diagram of the retainer.

As shown in FIG. 2, the retainer 6 comprises four small blades 60. The blades 60 are narrow and rectangular in the plane view, and located at the positions corresponding to the corners of a rectangle. The substrate 9 is transferred to the direction designated by the arrow in FIG. 2, and placed on the blades 60 to be retained. Each blade 60 is hung from the upper wall of the vacuum chamber 1 by a hanger 61. As shown in FIG. 1, a heater 62 is provided in each blade 6. This heater 62 also may be the resistance heating type.

As shown in FIG. 1, a cover 7 is provided in the upper area 103. The cover 7 is to cover the substrate 9 during the heating. The cover 7 is shallow-cup-shaped, directing its opening downward. The opening of the cover 7 is larger than the plane cross-sectional area of the acceptor 22. The inner surface of the cover 7 is a reflector reflecting radiation rays. The reflector is formed by mirror-polishing of the surface or deposition of a reflection film on the surface.

The cover 7 is capable of being carried by a cover carrier 71 provided outside the vacuum chamber 1. The cover carrier 71 elevates the cover 7 up and down. A holder 72 is provided to hold the cover 7. The cover 7 is hung at the bottom end of the holder 72. The holder 72 is rod-like and disposed vertically. The bottom end of the holder 72 is fixed on the upper surface of the cover 7 in the upper area 103. The upper end of the holder 72 is connected to a bracket 73 over the vacuum chamber 1.

Similarly to the body carrier 21, the cover carrier 71 comprises a driven screw 711 fixed to the bracket 73, a driving screw 712 engaging the driven screw 711, and a motor 713 rotating the driving screw 712. The cover 7 is elevated up and down with rotation by the motor 713. A bellows 74 is provided upward on the upper wall of the vacuum chamber 1. The bottom end of the bellows 74 surrounds the rim of the hole through which the holder 72 is inserted. The bellows 74 prevents leakage of vacuum through the hole.

A boosting-gas introduction line 75 is provided for enhancing the heating efficiency in the cover 7. The boosting-gas introduction line 75 introduces a gas inside the cover 7 during the heating, thereby boosting pressure around the substrate 9. A boosting-gas supply channel 751 is formed inside the holder 72. The boosting-gas supply channel 751 communicates with a gas inlet formed at the center of the cover 7. The boosting-gas introduction line 75 comprises a pipe 752 interconnecting the boosting-gas supply channel 751 and a gas bomb (not shown), and a valve 753 and a gas-flow controller (not shown) both provided on the pipe 752. A filter (not shown) is provided on the pipe 752 to prevent contamination of the substrate 9. As the boosting gas, inert gas such as argon or nitrogen may be used other than helium.

In the apparatus of this embodiment, the vacuum chamber 1 comprises a couple of pumping lines 13,14. One 13, hereinafter "first pumping line", evacuates the lower area 101 and the upper area 103 solely. The other one 14, hereinafter "second pumping line", evacuates the center area 102 solely.

The first pumping line 13 evacuates the areas 101,103 through an evacuation hole 15 provided in the bottom wall of the vacuum chamber 1. The first pumping line 13 comprises a main valve 131 provided close to the evacuation hole 15, a vacuum pump 132 evacuating the vacuum chamber 1 through the main valve 131, and a pumping speed controller (not shown).

Figure 3:
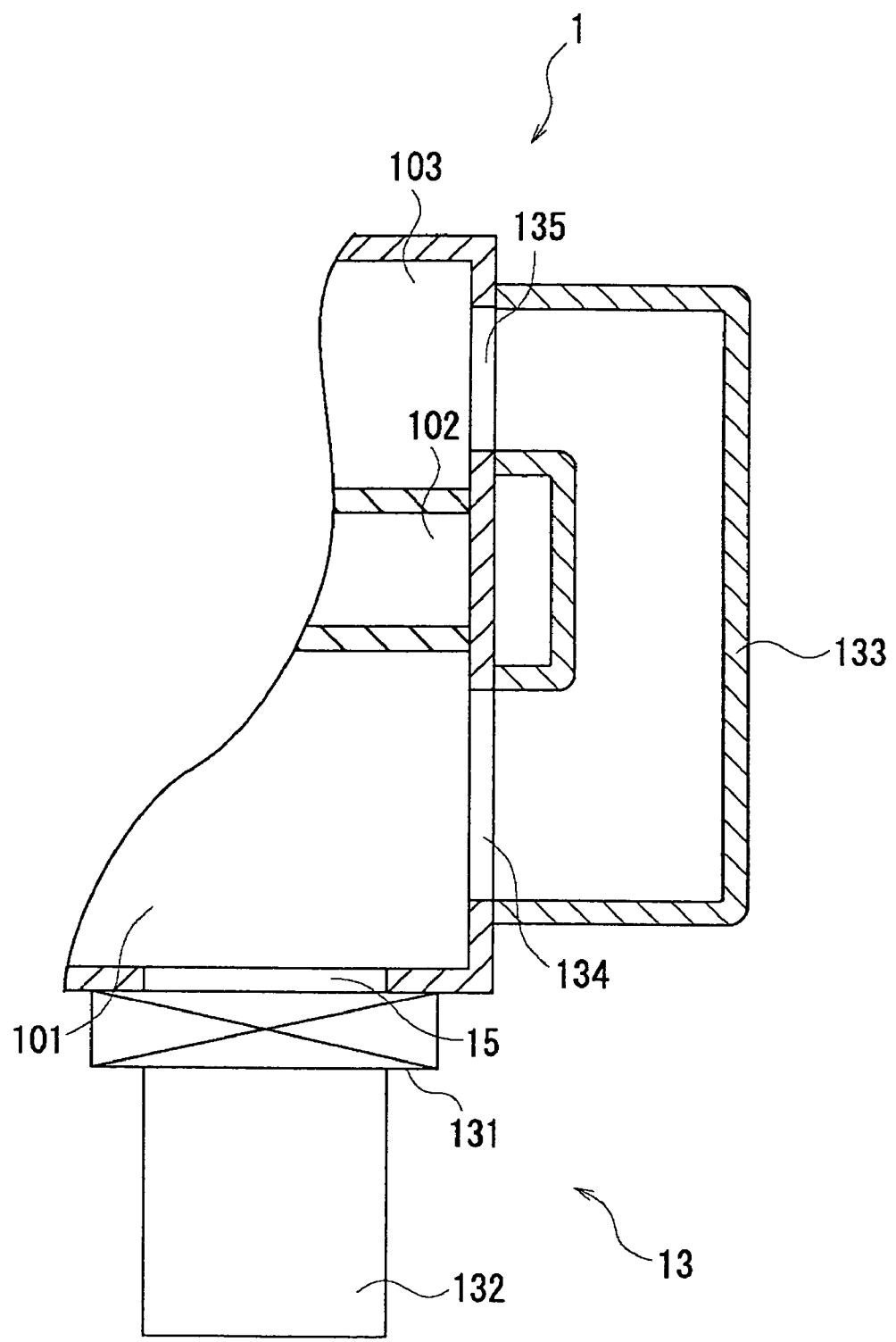
FIG. 3 is a schematic side cross-sectional view of the structure for evacuation by the first pumping line.

The structure for the evacuation by the first pumping line 13 will be described referring to the FIG. 3. As shown in FIG. 3, a bypass duct 133 is connected to the back wall of the vacuum chamber 1. In the back wall of the vacuum chamber 1, bypass holes 134,135 are provided respectively communicating with the lower area 101 and the upper area. The bypass duct 133 interconnects the bypass holes 134,135 air-tightly. In addition to the lower area 101, the first pumping line 13 evacuates the upper area 103 through the bypass duct 133.

The second pumping line 14 evacuates the center area 102 through an evacuation channel 141 provided in the side wall of the vacuum chamber 1. The entrance of the evacuation channel 141 is located beneath the gas outlet of the channel 51. The second pumping line 14 comprises a vacuum pump 143 evacuating the center area 102 through an evacuation pipe 142 connected to the evacuation channel 141, a valve 144 provided on the evacuation pipe 142, and a gas flow controller (not shown)

An inside opening through which the heat body 2 is capable of passing is provided in the lower partition 32. This inside opening is closed by a valve 321, hereinafter "lower vale". Another inside opening through which the cover 7 is capable of passing is provided in the upper partition 31. This inside opening is closed by a valve 311, hereinafter "upper valve".

The above-described apparatus is operated as follows. The first pumping line 13 evacuates the lower area 101 and the upper area 103 in advance at a required vacuum pressure. The gas-flow screening mechanism makes and maintains the flow of the screening gas. While the second pumping line 14 evacuates the screening gas flowing out, the center area 102 is kept at a pressure that is the same or essentially the same as the atmosphere.

In this state, the transfer valve 12 is opened. Then, the substrate 9 as the object of the heating is transferred into the center area 102 of the vacuum chamber 1 through the transfer opening 11. In this motion, the substrate 9 breaks through the screen-like flow of the screening gas, and is placed on the retainer 6 to be retained. This transfer operation is typically carried out by such an automatic mechanism as robot. Still, manual handling by an operator is not excluded in this invention.

The substrate 9 placed on the retainer 6 is right above the heat body 2. More preferably, the substrate 9 is placed at the co-axial position where the center of the heat body 2 and the center the substrate 9 are on the same vertical line. After the substrate 9 is transferred in, the transfer valve 12 is closed, and the gas-flow screening mechanism stops the operation. Afterward, the second pumping line 14 evacuates the center area 102 furthermore, making it at a required vacuum pressure. After confirming the center area 102 is kept at the required vacuum pressure by a vacuum gauge if necessary, the lower valve 321 is opened. Next, the body carrier 21 elevates up the heat body 2. The heat body 2 is stopped after the upper surface of the acceptor 22 contacts onto the substrate 9 and raises it a little. With this elevation, the substrate 9 is placed on the heat body 2, floating up from the retainer 6 a little.

As shown in FIG. 1, a slope is formed at the periphery of the acceptor 22. The end of each blade 60 is knife-edge-shaped, fitting the slope of the acceptor 22. Each blade 60 is located along the slope when the substrate 9 is passed onto the accepter 22.

The concavity 221 of the acceptor 22 is shut by the placed substrate 9. Then, the heat-exchange gas introduction line 4 starts introduction of the heat-exchange gas. As a result, pressure inside the concavity 221 is increased. The heat-exchange gas introduction line 4 controls the gas flow rate so as not to make the substrate 9 float up from the acceptor 22. The gas introduced into the concavity 221 slightly by slightly leaks out through the minute spaces at the interface of the acceptor 22 and the substrate 9.

Next, the upper valve 311 is opened. The cover 7 starts to be elevated down by the cover carrier 71. The cover 7 is stopped at a position where its bottom end is a little higher than the upper surface of the body base 21, covering the substrate 9 and the acceptor 22. Above the heat body 2 is disposed the retainer 6. The cover 7 has concavities fit for the shape of the retainer 6 so that it can not interfere with the motion of the retainer 6. In the state the cover 7 covers the substrate 9 and the acceptor 22, each blade 60 is located within each concavity respectively.

Next, operation of the boosting-gas introduction line 75 is started. The boosting gas is introduced into the inside of the cover 7, increasing pressure thereof. After filling the inside, the boosting gas little by little leaks from the clearance between the bottom end of the cover 7 and the body base 21 of the heat body 2. By the introduction of the boosting gas, pressure inside the cover 7 becomes positive against, i.e., higher than, other areas in the vacuum chamber 1.

Maintaining this situation, the heating of the substrate 9 is carried out for a require period. After the period, the operations of the boosting-gas introduction line 75 and the heat-exchange gas introduction line 4 are stopped. Then, the cover carrier 71 elevates up the cover 7 to the initial standby position. The body carrier 21 elevates down the heat body 2 to the initial standby position as well. During this elevation, the substrate 9 is placed on the retainer 6 again.

After the cover 7 returns to the standby position, the upper valve 311 is closed. After the heat body 2 returns to the standby position, the lower valve 321 is closed. Then, operation of the gas-flow screening mechanism is started. Afterward, the transfer valve 12 is opened, and the substrate 9 is picked up from the retainer 6 and transferred out from the vacuum chamber 1. The center area 102 may be ventilated to be at atmospheric pressure if necessary. In this case, the vacuum chamber 1 comprises a ventilation gas introduction line. Otherwise, the gas introduction by the gas-flow screening mechanism may be utilized for ventilation.

In the above-described operation of the apparatus, the retainer 6 is heated normally by the heater 62 provided therein. The atmosphere would flow into the center area 102 when the transfer valve 12 is opened for the transfer-in-and-out of the substrate 9. However, because the retainer 6 is heated, moisture in the atmosphere does not adhere to the retainer 6. Accordingly, oxidation of the retainer 6 is prevented. 50 to 70° C. is preferable as the temperature to prevent the moisture adhesion.

Showing a specific example of the heating, a silicon wafer is heated up at a hot temperature ranging from 100 to 600° C. in the case of the pre-heating prior to a thin-film deposition such as sputtering. The lower area 101 and the upper area 103 are evacuated to be at a vacuum pressure ranging from $10^{-2}$ to $10^{-4}$ Pa normally. Pressure inside the cover 7 to be positive by the boosting gas is $10^{-2}$ to $10^{-4}$ Pa, being a little higher in this range than other areas in the vacuum chamber 1. Pressure in the concavity 211 into which the heat-exchange gas is introduced is in the range of 133 to 2660 Pa.

In the operation of the apparatus, the environment in the center area 102 is alternately converted to atmospheric pressure and the vacuum pressure. The vacuum pump 143 on the second pumping line 14 repeats evacuation of the center area 102 from atmospheric pressure to the vacuum pressure. Therefore, the vacuum pump 143 is preferably one having a high pumping speed in a relatively high-pressure range, e.g., rotary pump or turbo-molecular pump as a roughing pump.

On the other hand, the lower area 101 and the upper area 103 are kept at the vacuum pressure normally. Therefore, the vacuum pump 132 on the first pumping line 13 is preferably one having a high pumping speed in a relatively low pressure range and having a low ultimate pressure, in view of preventing thermal oxidization of the heat body 2. For example, the pump 132 may be a diffusion pump or cryogenic pump. The vacuum pump 143 on the second pumping line 14 may be commonly used for a roughing pump on the first pumping line 13.

Figure 6:
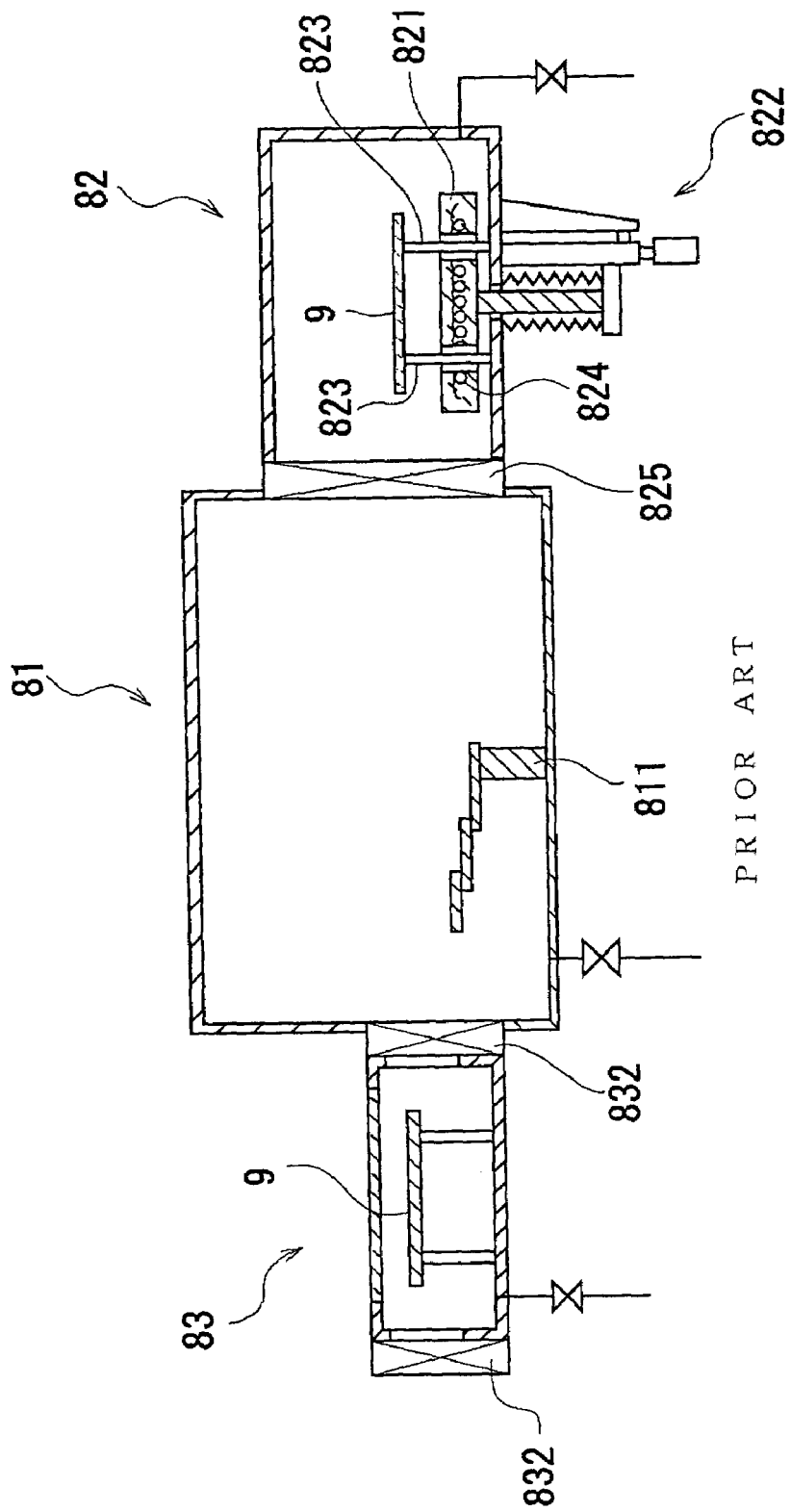
FIG. 6 is the schematic front cross-sectional view of a prior-art heating apparatus.
Figure 7:
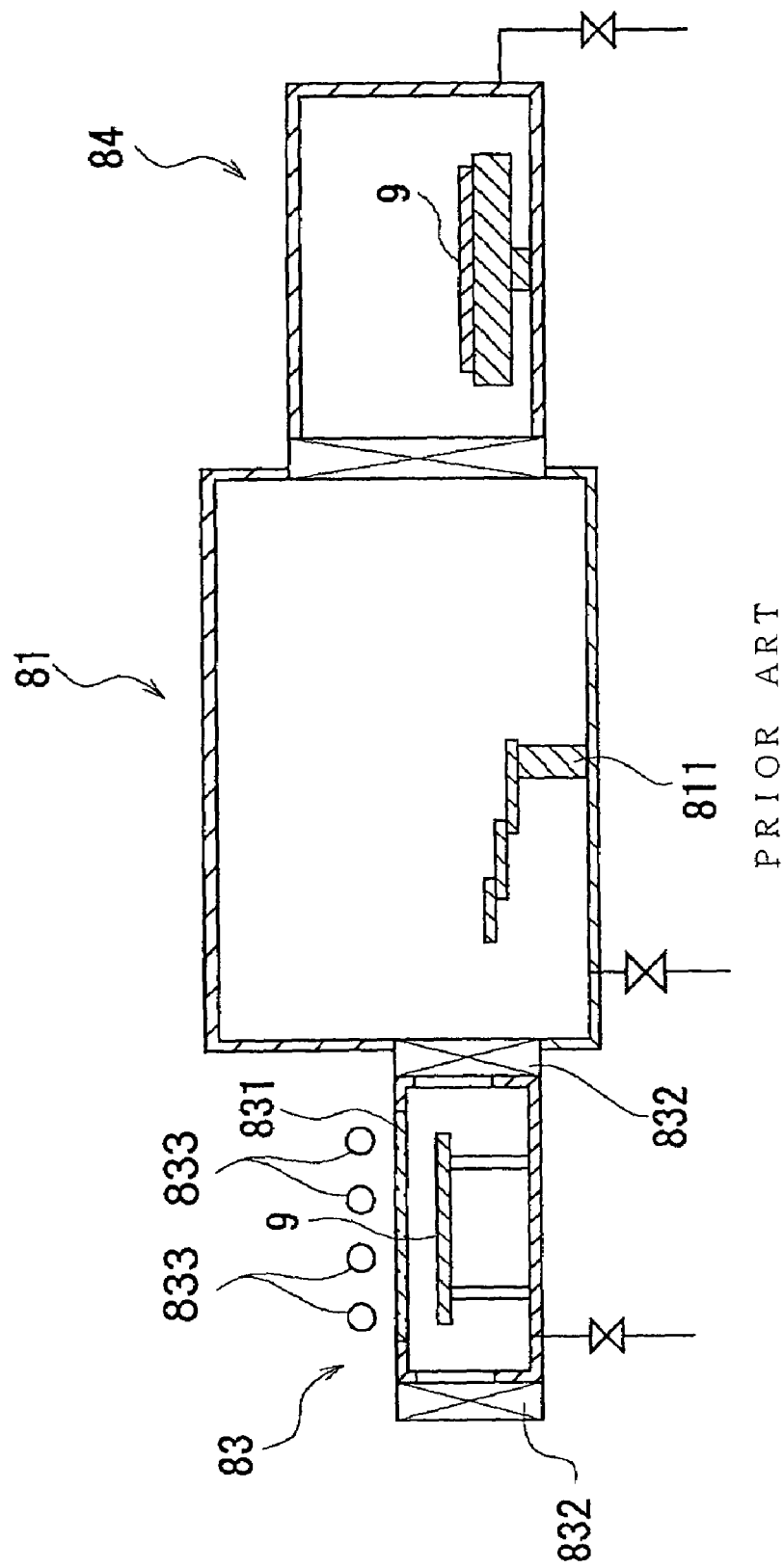
FIG. 7 is the schematic front cross-sectional view of another prior-art heating apparatus.

In the above-described apparatus of the embodiment, the heat body 2 is free from oxidization and adhesion of foreign matters. Therefore, the heat body 2 can never be a resource of contaminants, enabling the heating without contamination of the substrate 9. This result is also obtained in the case the substrate 9 is transferred directly from the outside atmosphere. Accordingly, the apparatus has no need to transfer the substrate 9 via a load-lock chamber, being a striking contrast to the prior-art apparatus shown in FIG. 6. Therefore, the apparatus has such merits as reduction of occupation space, reduction of apparatus cost, and increase of productivity, which are all brought from reduction of the number of chambers.

The above-described merits are much relevant to that the retainer 6 is provided in the center area 102. Unless the retainer 6, the substrate 9 would be passed to the heat body 2 by locomotion of the heat body 2 as in the prior-art apparatus shown in FIG. 6. In this case, because the heat body 2 at a hot temperature must be exposed to the atmosphere flowing in through the transfer opening 11, the heat body 2 is highly probably oxidized. This is the same in the case the substrate 9 is passed to the heat body 2 by lift pins. Unless a means for retaining the substrate 9 in state that the transfer valve 12 is closed and the center area 102 is isolated from the lower area 101 by the lower valve 321, the lower area 101 would communicate with the center area 102 before the center area 102 is evacuated sufficiently to be at a required vacuum pressure. This brings the problem that the heat body 2 is oxidized. However, the apparatus of this embodiment is free from this problem because of comprising the retainer 6.

In addition, because the heating is carried out not by radiation from a lamp heater but by the heat body 2 in contact with the substrate 9, i.e., by contact conduction of heat, it does not depend on material or state of the surface of the substrate 9. That is, it has the advantage of wider use. Moreover, because the boosting gas is introduced into the inside of the cover 7 by the boosting-gas introduction line 75 to increase pressure thereof, the substrate 9 is placed in the high-pressure environment during the heating. Therefore, the heating is carried out additionally utilizing the gas-molecular heat conduction including convection. Therefore, efficiency of the heating is enhanced more. The pressure-boosting inside the cover 7 during the heating also brings the advantage that contamination of the substrate 9 is prevented further. The positive pressure inside the cover 7 during the heating blocks intrusion of moisture, dusts and other contaminants, even if those exist in the center area 102. Accordingly, the substrate 9 is prevented from oxidation and contamination.

Because the inside surface of the cover 7 is the reflector, the radiant rays from the substrate 9 and the heat body 2 are reflected thereon, reaching the substrate 9. Therefore, efficiency of the heating is enhanced further. In addition, because the heat-exchange gas introduction line 4 introduces the heat-exchange gas into the interface of the substrate 9 and the heat body 2, the heat-exchange rate between them is enhanced, thereby enhancing efficiency of the heating furthermore.

Because the cover 7 is disposed on standby in the upper area 103 that is kept at a vacuum pressure normally, contamination of the substrate 9 via the cover 7 is prevented as well. If the cover 7 is disposed in the center area 102 on standby, moisture or dusts in the atmosphere might adhere to the cover 7 when the center area 102 is opened to the atmosphere. Adhering moisture or dusts would be detached from the surface to contaminate the substrate 9 when the cover 7 covers the substrate 9 during the heating. The apparatus of this embodiment is also free from this problem.

As described, the lower area 101 and the upper area 103 are evacuated by the second pumping line 13 normally, and the center area 102 where atmospheric pressure and the vacuum pressure are alternately repeated is evacuated by the second pumping line 14. This structure has the merit that each pumping line 13,14 can be optimized for the specific purposes. The structure that the lower area 101 and the upper area 103 are evacuated solely by the pumping line 13 brings the merit of simplifying the evacuation structure and reducing the apparatus cost.

The word "normally" appearing in the contexts such as "kept at a vacuum pressure normally" in this specification means "in a period while the apparatus is normally operated". Otherwise, this can be expressed as "all the time while the apparatus is regularly operated". For example, when operation of the apparatus is suspended for maintenance, the lower area 101 and the upper area 103 are ventilated to be at atmospheric pressure, not at a vacuum pressure. The heating of the retainer 6 by the heater 62 is also suspended in this situation.

Figure 4:
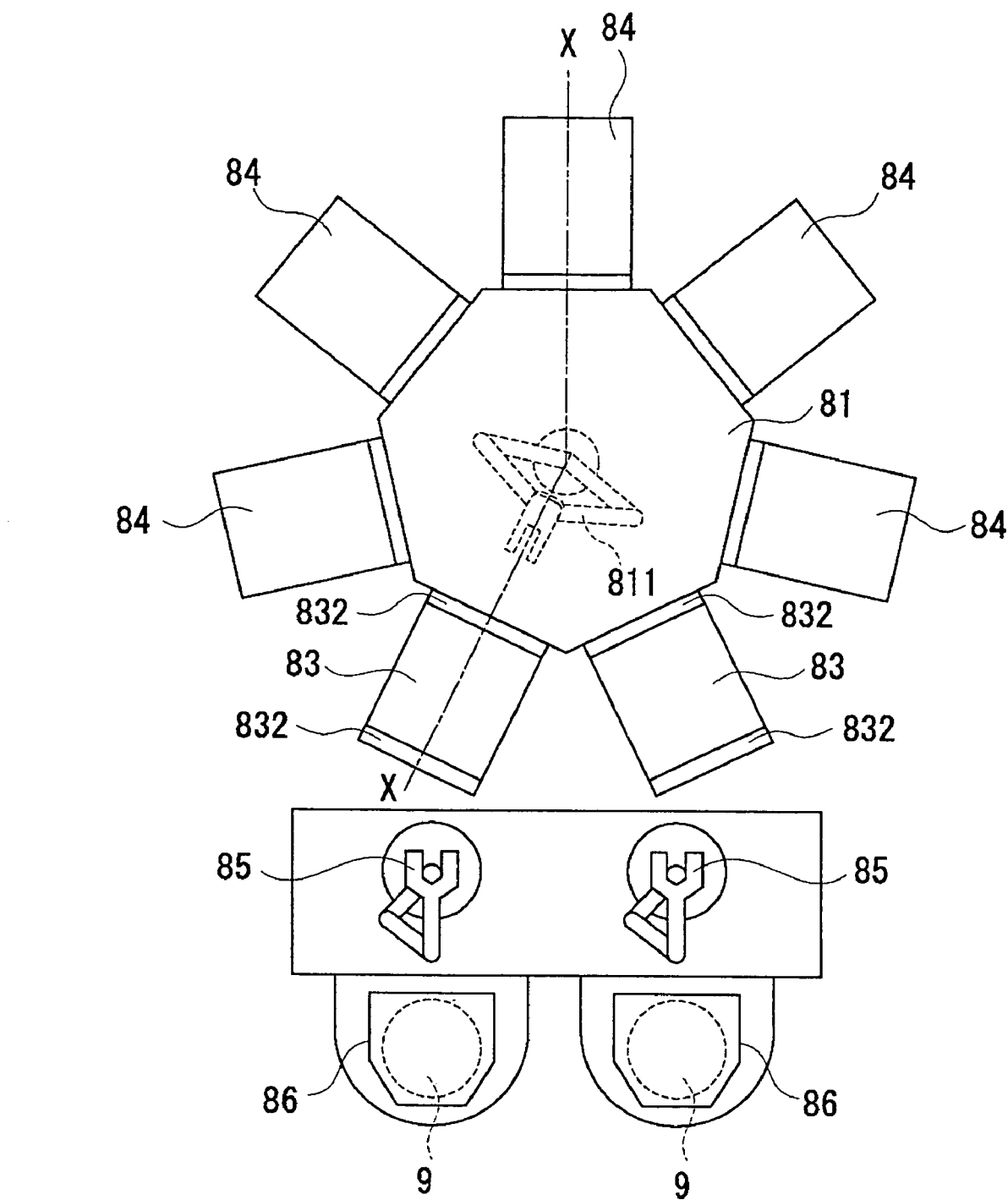
FIG. 4 is a schematic plane view of a multi-chamber substrate processing system as a preferred embodiment of the invention.
Figure 5:
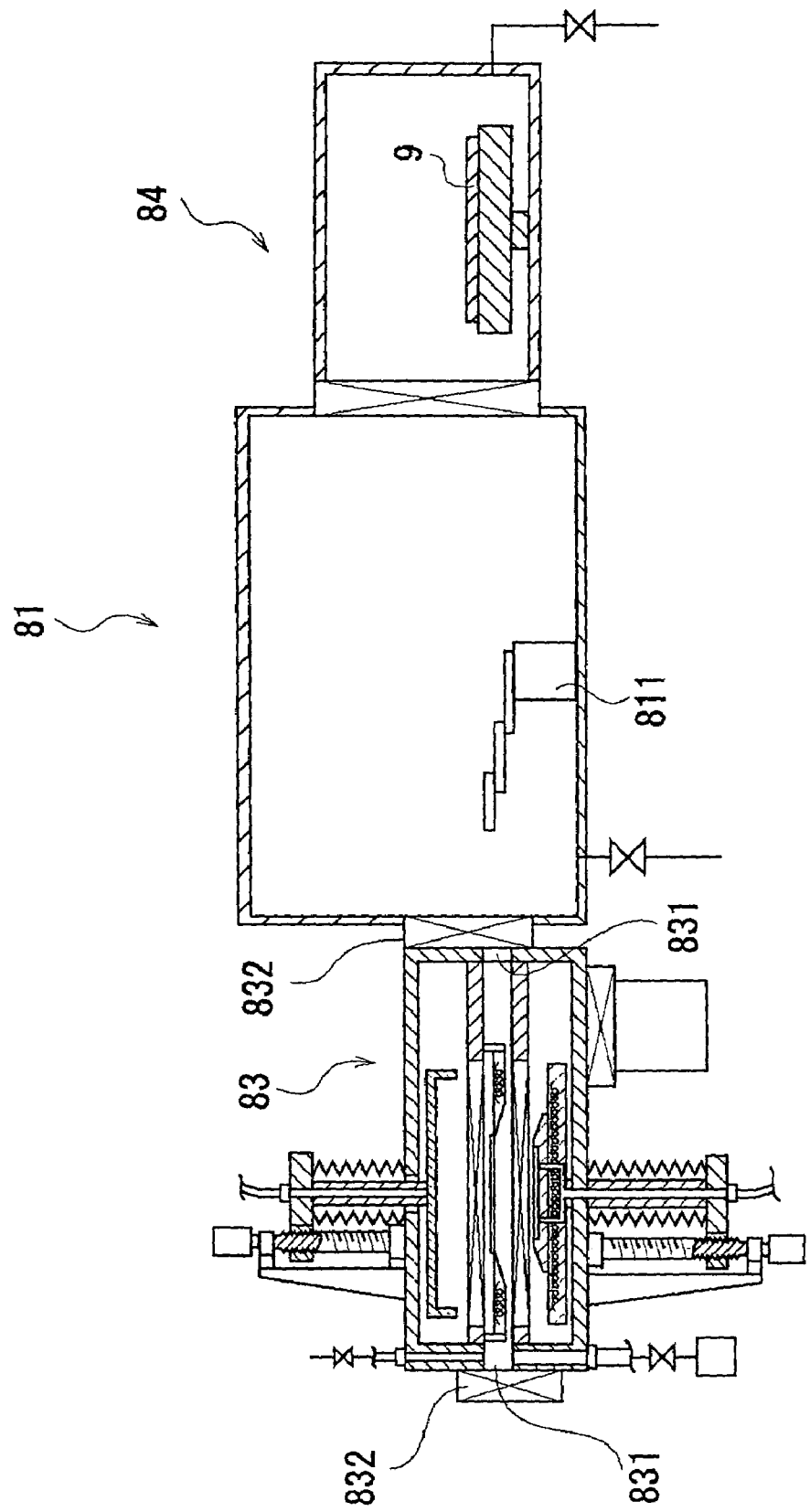
FIG. 5 is a schematic cross sectional view on the X—X plane in FIG. 4.

The multi-chamber substrate processing system as of the preferred embodiment will be described as follows. The system shown in FIGS. 4 and 5 belongs to the cluster-tool type as well as the prior-art system shown in FIG. 6. As shown in FIG. 4, a transfer chamber 81 is provided at the center, and process chambers 84 and load-lock chambers 83 are provided at the periphery. The process chambers 84 and the load-lock chambers 83 are air-tightly connected to the transfer chamber 81.

In this system, the substrate 9 is heated in the load-lock chamber 83. Concretely, components and the structure on the load-lock chamber 83 are almost the same as in the substrate heating apparatus shown in FIGS. 1 to 3, excepting that the load-lock chamber 83 comprises transfer openings 831 and transfer valves 832 respectively in the both side walls. One transfer opening 831 is for transferring the substrate 9 to and from the outside atmosphere, the other transfer opening 831 is for transferring the substrate 9 to and from the transfer chamber 81.

Description about the detailed structure of the load-lock chamber 83 is omitted because it is almost the same as the chamber 1 in the substrate heating apparatus shown in FIGS. 1 to 3. A transfer robot 811 provided in the transfer chamber 81 is the one holding the substrate 9 at the top of a multi-joint type arm for transferring it. The transfer robot 811 is preferably the one optimized for usage in vacuum environment, for example, without releasing dusts. Structures on the process chambers 84 are optimized according to the processes carried out therein. In the case a multilayer film is deposited, for example, each means for depositing each layer is provided in each process chamber 84 respectively. Cassettes 86 in which unprocessed or processed substrates 9 are stored are provided at the atmospheric outside. Auto loaders 85 are provided for transferring the substrates 9 between the cassettes 86 and the load-lock chambers 83.

In this system, any of the substrates 9 is transferred by any of the auto loaders 85 from any of the cassettes 83 to any of the load-lock chambers 83, and then heated by the heat body. The heated substrate 9 is transferred by the transfer robot 811 from the load-lock chamber 83 to any of process chambers 84. After the process in the process chamber 84, the substrate 9 is transferred to other process chambers 84 in order. After all the processes are finished, the substrate 9 is returned to any of the cassettes 86 via any of the load-lock chambers 83. In returning the processed substrate 9 to the cassette 86, after the transfer robot 811 places the substrate 9 on the retainer, any of the auto loaders 85 accepts the substrate 9 from the retainer 6 and takes it out of the load-lock chamber 83 to the cassette 86. If the substrate 9 is heated after the processes, the substrate 9 is passed to the acceptor by the same motion as described. The heated substrate 9 is transferred out via the retainer by the same motion as described.

The multi-chamber substrate processing system of this embodiment does not need any extra chamber for heating the substrate 9 because the substrate 9 is heated in the load-lock chamber 83. Therefore, the system has the merits of occupation space reduction and cost reduction both brought by reduction of the number of the chambers. In addition, the system is advantageous especially in a complicated process comprising many steps, because an extra process chamber can be provided at the space for a heating chamber.

The multi-chamber substrate processing system of this invention may be any of the inline type, instead of the cluster-tool type. A system of the inline type has a structure where a multiplicity of chambers are provided in a line. Also in this type, a substrate is transferred initially into to a load-lock chamber and heated therein.

In the above-described embodiments, the second area is sandwiched by the first area and the third area. That is, the first area is the lower area 101, the second area is the center area 102, and the third area is the upper area 103. This point is not limitative for this invention at all. It may be possible that the area in which the heat body is disposed on standby is at the upper side, and the area in which the cover is disposed on standby is at the lower side. The first and third areas may be located at the sides of the second area, sandwiching it. This structure is practical in the case the substrate 9 posing upright is transferred into the vacuum chamber.

In the described embodiment, the heat body 2 was carried to be contacted with the substrate 9. Instead of this, the substrate 9 may be carried to be contacted onto the heat body 2. In this case, the inside opening is the one through which the substrate 9 is capable of passing. A mechanism carrying the retainer 6 with the substrate 9 placed thereon may be provided. In this case, the inside opening is the one through which the retainer and the substrate 9 are capable of passing. This mechanism passes the substrate 9 from the retainer 6 to the heat body 2. A multiplicity of pins capable of being lifted up and down may be provided for receiving the substrate 9. After receiving the substrate 9, the pins are lifted down to contact the substrate 9 onto the heat body 2.

Instead of carrying the cover 7 to cover the substrate 9, the substrate 9 and the heat body 2 may be carried together to the position where the cover 7 covers the substrate 9. Concretely, the body carrier 21 may be designed so that the heat body 2 can be elevated up to the position where the cover 7 covers the substrate 9. In this structure, a mechanism for making the retainer 7 retreat so as not to interfere with the movement of the heat body 2.

Though the described each embodiment comprises the couple of the pumping lines, only one pumping line may be provided and commonly used. In this case, each area is evacuated at optimum timing by the open-close operation of each valve provided on each evacuation pipe.

What is claimed is:
1. A substrate heating apparatus, comprising:
a vacuum chamber comprising a pumping line;
a heat body heating a substrate contacted thereon in the vacuum chamber;
a partition separating the inside of the vacuum chamber into two areas of the first and the second;
an inside opening provided in the partition, through which the heat body is capable of passing;
a partition valve closing the inside opening;
a transfer opening provided in a wall of the vacuum chamber, through which the substrate is transferred from and to the atmospheric outside;
a transfer valve closing the transfer opening;
a retainer retaining the substrate in the second area of the vacuum chamber; and
a carrier carrying the heat body through the inside opening;
the transfer opening and the transfer valve both being provided at the second area;
the first area being normally evacuated at a vacuum pressure by the pumping line;
the second area being at atmospheric pressure while the substrate is transferred from and to the atmospheric outside, and evacuated at a vacuum pressure by the pumping line while the partition valve is opened;
the pumping line evacuating the second area after the substrate is transferred therein and the transfer opening is closed by the transfer valve;
the heat body being disposed in the first area;
the partition valve being opened after the second area is evacuated at a vacuum pressure by the pumping line;

the carrier carrying the heat body through the inside opening after the partition valve is opened, thereby contacting the substrate onto the heat body.

2. A substrate heating apparatus, comprising:
a vacuum chamber comprising a pumping line;
a heat body heating a substrate contacted thereon in the vacuum chamber;
a partition separating the inside of the vacuum chamber into two areas of the first and the second;
an inside opening provided in the partition, through which the substrate is capable of passing;
a partition valve closing the inside opening;
a transfer opening provided in the wall of the vacuum chamber, through which the substrate is transferred from and to the atmospheric outside;
a transfer valve closing the transfer opening;
a retainer retaining the substrate in the second area of the vacuum chamber; and
a carrier carrying the substrate through the inside opening;
the partition valve is the vacuum valve closing the inside opening to isolate the first area from the second area so that the first area is at a vacuum pressure when the second area is at atmospheric pressure;
the transfer opening and the transfer valve both being provided at the second area;
the first area being normally evacuated at a vacuum pressure by the pumping line;
the second area being at atmospheric pressure while the substrate is transferred from and to the atmospheric outside, and evacuated at a vacuum pressure by the pumping line while the partition valve is opened;
the pumping line evacuating the second area after the substrate is transferred therein and the transfer opening is closed by the transfer valve;
the heat body being disposed in the first area on standby;
the partition valve being opened after the second area is evacuated at a vacuum pressure by the pumping line;
the carrier carrying the substrate through the inside opening after the partition valve is opened, thereby contacting the substrate onto the heat body.

3. A substrate heating apparatus as claimed in claim 1, further comprising a heater heating the retainer, thereby preventing moisture from adhering thereto.

4. A substrate heating apparatus as claimed in claim 2, further comprising a heater heating the retainer, thereby preventing moisture from adhering thereto.

5. A substrate heating apparatus as claimed in claim 1, further comprising a cover covering the substrate contacted onto the heat body, and a gas introduction line introducing a gas into the inside of the cover, increasing pressure thereof.

6. A substrate heating apparatus as claimed in claim 2, further comprising a cover covering the substrate contacted onto the heat body, and a gas introduction line introducing a gas into the inside of the cover, increasing pressure thereof.

7. A substrate heating apparatus as claimed in claim 5, the inner surface of the cover being a reflector reflecting radiant rays.

8. A substrate heating apparatus as claimed in claim 6, the inner surface of the cover being a reflector reflecting radiant rays.

9. A substrate heating apparatus as claimed in claim 5, further comprising;
an extra partition forming the third area in the vacuum chamber,
an extra inside opening provided in the extra partition, through which the cover is capable of passing,
an extra inside valve closing the extra inside opening, and
an extra carrier carrying the cover,
the cover being disposed in the third area,
the third area being normally evacuated at a vacuum pressure by the pumping line,
the extra carrier carrying the cover through the extra inside opening to a position where the cover covers the substrate.

10. A substrate heating apparatus as claimed in claim 5, further comprising;
an extra partition forming the third area in the vacuum chamber,
an extra inside opening provided in the extra partition, through which the substrate and the heat body are capable of passing,
an extra inside valve closing the extra inside opening, and
an extra carrier carrying the substrate with the heat body,
the cover being disposed in the third area on standby,
the third area being normally evacuated at a vacuum pressure by the pumping line,
the extra carrier carrying the substrate with the heat body through the extra inside opening to a position where the cover covers the substrate.

11. A substrate heating apparatus as claimed in claim 6, further comprising;
an extra partition forming the third area in the vacuum chamber,
an extra inside opening provided in the extra partition, through which the cover is capable of passing,
an extra inside valve closing the extra inside opening, and
an extra carrier carrying the cover,
the extra inside valve is the vacuum valve closing the extra inside opening to isolate the third area from the second area so that the third area is at a vacuum pressure when the second area is at atmospheric pressure;
the cover being disposed in the third area on standby,
the third area being normally evacuated at a vacuum pressure by the pumping line,
the extra carrier carrying the cover through the extra inside opening to a position where the cover covers the substrate.

12. A substrate heating apparatus as claimed in claim 6, further comprising;
an extra partition forming the third area in the vacuum chamber,
an extra inside opening provided in the extra partition, through which the substrate and the heat body are capable of passing,
an extra inside valve closing the extra inside opening, and
an extra carrier carrying the substrate with the heat body,
the extra inside valve is the vacuum valve closing the extra inside opening to isolate the third area from the second area so that the third area is at a vacuum pressure when the second area is at atmospheric pressure;
the cover being disposed in the third area,
the third area being normally evacuated at a vacuum pressure by the pumping line,
the extra carrier carrying the substrate with the heat body through the extra inside opening to a position where the cover covers the substrate.

13. A substrate heating apparatus, comprising:

a vacuum chamber comprising a couple of pumping lines;

a heat body heating a substrate contacted thereon in the vacuum chamber;

a partition separating the inside of the vacuum chamber into two areas of the first and the second;

an inside opening provided in the partition, through which the heat body is capable of passing;

a partition valve closing the inside opening;

a transfer opening provided in a wall of the vacuum chamber, through which the substrate is transferred from and to the atmospheric outside;

a transfer valve closing the transfer opening;

a retainer retaining the substrate in the second area of the vacuum chamber; and a carrier carrying the heat body through the inside opening;

the transfer opening and the transfer valve both being provided at the second area;

the first area being normally evacuated at a vacuum pressure by one of the pumping lines;

the second area being at atmospheric pressure while the substrate is transferred from and to the atmospheric outside, and evacuated at a vacuum pressure by the other one of the pumping lines while the partition valve is opened;

the other one of the pumping lines evacuating the second area after the substrate is transferred therein and the transfer opening is closed by the transfer valve;

the heat body being disposed in the first area on standby;

the partition valve being opened after the second area is evacuated at a vacuum pressure by the other one of the pumping lines;

the carrier carrying the heat body through the inside opening after the partition valve is opened, thereby contacting the substrate onto the heat body.

14. A substrate heating apparatus, comprising:

a vacuum chamber comprising a couple of pumping lines;

a heat body heating a substrate contacted thereon in the vacuum chamber;

a partition separating the inside of the vacuum chamber into two areas of the first and the second;

an inside opening provided in the partition, through which the substrate is capable of passing;

a partition valve closing the inside opening;

a transfer opening provided in a wall of the vacuum chamber, through which the substrate from and to the atmospheric outside;

a transfer valve closing the transfer opening;

a retainer retaining the substrate in the second area of the vacuum chamber; and a carrier carrying the substrate through the inside opening;

the partition valve is the vacuum valve closing the inside opening to isolate the first area from the second area so that the first area is at a vacuum pressure when the second area is at atmospheric pressure;

the transfer opening and the transfer valve both being provided at the second area;

the first area being normally evacuated at a vacuum pressure by one of the pumping lines;

the second area being at atmospheric pressure while the substrate is transferred from the atmospheric outside, and evacuated at a vacuum pressure by the other one of the pumping lines while the partition valve is opened;

the other one of the pumping lines evacuating the second area after the substrate is transferred therein and the transfer opening is closed by the transfer valve;

the heat body being disposed in the first area;

the partition valve being opened after the second area is evacuated at a vacuum pressure by the other one of the pumping lines;

the carrier carrying the substrate through the inside opening after the partition valve is opened, thereby contacting the substrate onto the heat body.

15. A multi-chamber substrate processing system, comprising:

a transfer chamber;

a load-lock chamber and a process chamber both provided on the periphery of the transfer chamber;

a robot transferring a substrate from the load-lock chamber to the process chamber via the transfer chamber;

a pumping line evacuating the load-lock chamber;

a heat body heating the substrate contacted thereon in the load-lock chamber;

a partition separating the inside of the load-lock chamber into two areas of the first and the second;

an inside opening provided in the partition, through which the heat body is capable of passing;

a partition valve closing the inside opening;

a first transfer opening provided in a wall of the load-lock chamber, through which the substrate is transferred from the atmospheric outside;

a first transfer valve closing the first transfer opening;

a retainer retaining the substrate in the second area of the load-lock chamber;

a second transfer opening provided in another wall of the load-lock chamber, through which the substrate is transferred to the transfer chamber;

a second transfer valve closing the second transfer opening; and a carrier carrying the heat body through the inside opening;

the first transfer opening and the first transfer valve both being provided at the second area;

the first area being normally evacuated at a vacuum pressure by the pumping line;

the second area being at atmospheric pressure while the substrate is transferred from the atmospheric outside, and evacuated at a vacuum pressure by the pumping line while the partition valve is opened;

the pumping line evacuating the second area after the substrate is transferred therein and the first transfer opening is closed by the first transfer valve;

the heat body being disposed in the first area on standby;

the partition valve being opened after the second area is evacuated at a vacuum pressure by the pumping line;

the carrier carrying the heat body through the inside opening after the partition valve is opened, thereby contacting the substrate onto the heat body.

16. A multi-chamber substrate processing system, comprising:

a transfer chamber;

a load-lock chamber and a process chamber both provided on the periphery of the transfer chamber;

a robot transferring a substrate from the load-lock chamber to the process chamber via the transfer chamber;

a pumping line evacuating the load-lock chamber;

a heat body heating the substrate contacted thereon in the load-lock chamber;

a partition separating the inside of the load-lock chamber into two areas of the first and the second;

an inside opening provided in the partition, through which the substrate is capable of passing;

a partition valve closing the inside opening;

a first transfer opening provided in a wall of the load-lock chamber, through which the substrate is transferred from the atmospheric outside;

a first transfer valve closing the first transfer opening;

a retainer retaining the substrate in the second area of the load-lock chamber;

a second transfer opening provided in another wall of the load-lock chamber, through which the substrate is transferred to the transfer chamber;

a second transfer valve closing the second transfer opening; and a carrier carrying the substrate through the inside opening;

the partition valve is the vacuum valve closing the inside opening to isolate the first area from the second area so that the first area is at a vacuum pressure when the second area is at atmospheric pressure;

the first transfer opening and the first transfer valve both being provided at the second area;

the first area being normally evacuated at a vacuum pressure by the pumping line;

the second area being at atmospheric pressure while the substrate is transferred from the atmospheric outside, and evacuated at a vacuum pressure while the partition valve is opened;

the pumping line evacuating the second area after the substrate is transferred therein and the first transfer opening is closed by the first transfer valve;

the partition valve being opened after the second area is evacuated at a vacuum pressure by the pumping line;

the carrier carrying the substrate through the inside opening after the partition valve is opened, thereby contacting the substrate onto the heat body.

17. A multi-chamber substrate processing system as claimed in claim 15,
further comprising a heater heating the retainer, thereby preventing moisture from adhering thereto.

18. A multi-chamber substrate processing system as claimed in claim 16,
further comprising a heater heating the retainer, thereby preventing moisture from adhering thereto.

19. A multi-chamber substrate processing system as claimed in claim 15,
further comprising a cover covering the substrate contacted onto the heat body, and a gas introduction line introducing a gas into the inside of the cover, increasing pressure thereof.

20. A multi-chamber substrate processing system as claimed in claim 16,
further comprising a cover covering the substrate contacted onto the heat body, and a gas introduction line introducing a gas into the inside of the cover, increasing pressure thereof.

21. A multi-chamber substrate processing system as claimed in claim 19,
the inner surface of the cover being a reflector reflecting radiant rays.

22. A multi-chamber substrate processing system as claimed in claim 20,
the inner surface of the cover being a reflector reflecting radiant rays.

23. A multi-chamber substrate processing system as claimed in claim 19,
further comprising;
an extra partition forming the third area in the load-lock chamber,
an extra inside opening provided in the extra partition,
an extra inside valve closing the extra inside opening, and
an extra carrier carrying the cover,
the third area being normally evacuated at a vacuum pressure by the pumping line,
the extra carrier carrying the cover through the extra inside opening to a position where the cover covers the substrate.

24. A multi-chamber substrate processing system as claimed in claim 19,
further comprising;
an extra partition forming the third area in the load-lock chamber,
an extra inside opening provided in the extra partition, through which the substrate and the heat body are capable of passing,
an extra inside valve closing the extra inside opening,
and an extra carrier carrying the substrate with the heat body,
the cover being disposed in the third area on standby,
the third area being normally evacuated at a vacuum pressure by the pumping line,
the extra carrier carrying the substrate with the heat body through the extra inside opening to a position where the cover covers the substrate.

25. A multi-chamber substrate processing system as claimed in claim 20,
further comprising;
an extra partition forming the third area in the load-lock chamber,
an extra inside opening provided in the extra partition,
an extra inside valve closing the extra inside opening, and
an extra carrier carrying the cover,
the extra inside valve is the vacuum valve closing the extra inside opening to isolate the third area from the second area so that the third area is at a vacuum pressure when the second area is at atmospheric pressure;
the cover being disposed in the third area on standby,
the third area being normally evacuated at a vacuum pressure by the pumping line,
the extra carrier carrying the cover through the extra inside opening to a position where the cover covers the substrate.

26. A multi-chamber substrate processing system as claimed in claim 20,
further comprising;
an extra partition forming the third area in the load-lock chamber,
an extra inside opening provided in the extra partition, through which the substrate and the heat body are capable of passing,
an extra inside valve closing the extra inside opening,
and an extra carrier carrying the substrate with the heat body,
the extra inside valve is the vacuum valve closing the extra inside opening to isolate the third area from the second area so that the third area is at a vacuum pressure when the second area is at atmospheric pressure;
the third area being normally evacuated at a vacuum pressure by the pumping line,
the extra carrier carrying the substrate with the heat body through the extra inside opening to a position where the cover covers the substrate.

27. A multi-chamber substrate processing system, comprising:
- a transfer chamber;
- a load-lock chamber and a process chamber both provided on the periphery of the transfer chamber;
- a robot transferring a substrate from the load-lock chamber to the process chamber via the transfer chamber;
- a couple of pumping lines evacuating the load-lock chamber;
- a heat body heating the substrate contacted thereon in the load-lock chamber;
- a partition separating the inside of the load-lock chamber into two areas of the first and the second;
- an inside opening provided in the partition, through which the heat body is capable of passing;
- a partition valve closing the inside opening;
- a first transfer opening provided in a wall of the load-lock chamber, through which the substrate is transferred from the atmospheric outside;
- a first transfer valve closing the first transfer opening;
- a retainer retaining the substrate in the second area of the load-lock chamber;
- a second transfer opening provided in another wall of the load-lock chamber, through which the substrate is transferred to the transfer chamber;
- a second transfer valve closing the second transfer opening; and
- a carrier carrying the heat body through the inside opening;
- the first transfer opening and the first transfer valve both being provided at the second area;
- the first area being normally evacuated at a vacuum pressure by one of the pumping lines;
- the second area being at atmospheric pressure while the substrate is transferred from the atmospheric outside, and evacuated at a vacuum pressure by the other one of the pumping lines while the partition valve is opened;
- the other one of the pumping lines evacuating the second area after the substrate is transferred therein and the first transfer opening is closed by the first transfer valve;
- the heat body being disposed in the first area on standby;
- the partition valve being opened after the second area is evacuated at a vacuum pressure by the other one of the pumping lines;
- the carrier carries the heat body through the inside opening after the partition valve is opened, thereby contacting the substrate onto the heat body.

28. A multi-chamber substrate processing system, comprising:
- a transfer chamber;
- a load-lock chamber and a process chamber both provided on the periphery of the transfer chamber;
- a robot transferring a substrate from the load-lock chamber to the process chamber via the transfer chamber;
- a couple of pumping lines evacuating the load-lock chamber;
- a heat body heating the substrate contacted thereon in the load-lock chamber;
- a partition separating the inside of the load-lock chamber into two areas of the first and the second;
- an inside opening provided in the partition, through which the substrate is capable of passing;
- a partition valve closing the inside opening;
- a first transfer opening provided in a wall of the load-lock chamber, through which the substrate is transferred from the atmospheric outside;
- a first transfer valve closing the first transfer opening;
- a retainer retaining the substrate in the second area of the load-lock chamber;
- a second transfer opening provided in another wall of the load-lock chamber, through which the substrate is transferred to the transfer chamber;
- a second transfer valve closing the second transfer opening; and
- a carrier carrying the substrate through the inside opening;
- the partition valve is the vacuum valve closing the inside opening to isolate the first area from the second area so that the first area is at a vacuum pressure when the second area is at atmospheric pressure;
- the first transfer opening and the first transfer valve both being provided at the second area;
- the first area being normally evacuated at a vacuum pressure by one of the pumping lines;
- the second area being at atmospheric pressure while the substrate is transferred from the atmospheric outside, and evacuated at a vacuum pressure by the other one of the pumping lines while the partition valve is opened;
- the other one of the pumping lines evacuating the second area after the substrate is transferred therein and the first transfer opening is closed by the first transfer valve;
- the heat body being disposed in the first area on standby;
- the partition valve being opened after the second area is evacuated at a vacuum pressure by the other one of the pumping lines;
- the carrier carrying the substrate through the inside opening after the partition valve is opened, thereby contacting the substrate onto the heat body.

29. A multichamber substrate processing system as claimed in claim 3, wherein the heater heats the retainer at a temperature in the range of 50 to 70° C.

30. A multi-chamber substrate processing system as claimed in claim 4, wherein the heater heats the retainer at a temperature in the range of 50 to 70° C.

31. A multi-chamber substrate processing system as claimed in claim 15, wherein the heater heats the retainer at a temperature in the range of 50 to 70° C.

32. A multi-chamber substrate processing system as claimed in claim 16, wherein the heater heats the retainer at a temperature in the range of 50 to 70° C.

* * * * *